United States Patent
Cho et al.

(10) Patent No.: US 8,599,205 B2
(45) Date of Patent: Dec. 3, 2013

(54) METHOD FOR DISPLAYING BATTERY RESIDUAL QUANTITY IN PORTABLE TERMINAL HAVING SELF-LUMINESCENCE DISPLAY AND APPARATUS THEREFOR

(75) Inventors: Jae-Hun Cho, Yongin-si (KR); Min-Woo Lee, Suwon-si (KR); Sung-Dae Cho, Yongin-si (KR); Yong-Deok Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 303 days.

(21) Appl. No.: 13/016,360

(22) Filed: Jan. 28, 2011

(65) Prior Publication Data

US 2011/0181599 A1   Jul. 28, 2011

(30) Foreign Application Priority Data

Jan. 28, 2010   (KR) .................. 10-2010-0008055

(51) Int. Cl.
*G06T 11/20* (2006.01)
*G09G 5/00* (2006.01)

(52) U.S. Cl.
USPC .................. 345/440; 345/441; 345/211

(58) Field of Classification Search
USPC ........................................ 345/440
See application file for complete search history.

(56) References Cited

U.S. PATENT DOCUMENTS 5,545,969 A * 8/1996 Hasegawa ............ 320/134
2008/0100554 A1 * 5/2008 Mori ..................... 345/89

* cited by examiner

*Primary Examiner* — Kee M Tung
*Assistant Examiner* — Leon T Cain, II
(74) *Attorney, Agent, or Firm* — The Farrell Law Firm, P.C.

(57) ABSTRACT

A method and apparatus for displaying a battery residual quantity of a portable terminal having a self-luminescence display are provided. The brightness of an image frame is determined by analyzing a histogram of the image frame output through the self-luminescence display. A power consumption of the self-luminescence display is determined based on the brightness of the image frame output through the self-luminescence display. A battery voltage and a battery voltage variance value are determined. The battery residual quantity is displayed in accordance with the power consumption of the self-luminescence display and the battery voltage variance value.

20 Claims, 7 Drawing Sheets

METHOD FOR DISPLAYING BATTERY RESIDUAL QUANTITY IN PORTABLE TERMINAL HAVING SELF-LUMINESCENCE DISPLAY AND APPARATUS THEREFOR

PRIORITY

This application claims priority under 35 U.S.C. §119(a) to a Korean Patent Application filed in the Korean Intellectual Property Office on Jan. 28, 2010 and assigned Serial No. 10-2010-0008055, the contents of which are incorporated herein by reference.

BACKGROUND OF THE INVENTION

1. Field of the Invention

The present invention relates generally to a portable terminal, and more particularly, to a method for displaying battery residual quantity in a portable terminal having a self-luminescence display.

2. Description of the Related Art

A self-luminescence display rapidly increases power consumption exponentially as the brightness and whiteness of an image increases according to a device characteristic. The self-luminescence display accounts for a maximum of over 30% of the power consumption of a portable terminal. Thus, the power consumption of the self-luminescence device, according to a brightness change of an image, significantly affects the entire power consumption of the portable terminal.

A portable terminal having a passive luminescent display displays a battery residual quantity by monitoring a voltage applied from the battery through a wireless modem, comparing the monitored voltage with a reference voltage, and reflecting a decreasing voltage value in real-time.

However, if the brightness of an image output through a self-luminescence display is rapidly changed in a terminal having the self-luminescence display, a large amount of voltage is instantaneously consumed by the self-luminescence display. Accordingly, if a portable terminal having a self-luminescence display displays battery residual quantity in the same way as a portable terminal having a passive luminescent device display, the battery residual quantity may occasionally fluctuate and display according to the brightness of the self-luminescence display since a change of an instantaneously consumed voltage is reflected onto the battery residual quantity.

SUMMARY OF THE INVENTION

The present invention has been made to address at least the above problems and/or disadvantages and to provide at least the advantages below. Accordingly, an object of the present invention is to provide a method for displaying battery residual quantity by compensating for a voltage instantaneously dropped by a self-luminescence display and a terminal apparatus therefore.

According to one aspect of the present invention, a method is provided for displaying a battery residual quantity of a portable terminal having a self-luminescence display. The brightness of an image frame is determined by analyzing a histogram of the image frame output through the self-luminescence display. A power consumption of the self-luminescence display is determined based on the brightness of the image frame output through the self-luminescence display. A battery voltage and a battery voltage variance value are determined. The battery residual quantity is displayed in accordance with the power consumption of the self-luminescence display and the battery voltage variance value.

According to another aspect of the present invention, a terminal is provided having a self-luminescence display. The terminal includes an image analyzer for determining a brightness value of an image frame by analyzing a histogram of the image frame displayed through the self-luminescence display, and a battery for supplying power required to drive the self-luminescence display. The terminal also includes a controller for receiving the brightness value of the image frame displayed through the self-luminescence display, determining a power consumption of the self-luminescence display corresponding to the brightness value of the image frame displayed through the self-luminescence display, determining a battery voltage and a battery voltage variance value, and displaying the battery residual quantity through the self-luminescence display in accordance with the power consumption of the self-luminescence display and the battery voltage variance value.

BRIEF DESCRIPTION OF THE DRAWINGS

The above and other aspects, features and advantages of the present invention will become more apparent from the following detailed description when taken in conjunction with the accompanying drawing in which.

DETAILED DESCRIPTION OF EMBODIMENTS OF THE PRESENT INVENTION

Figure 1:
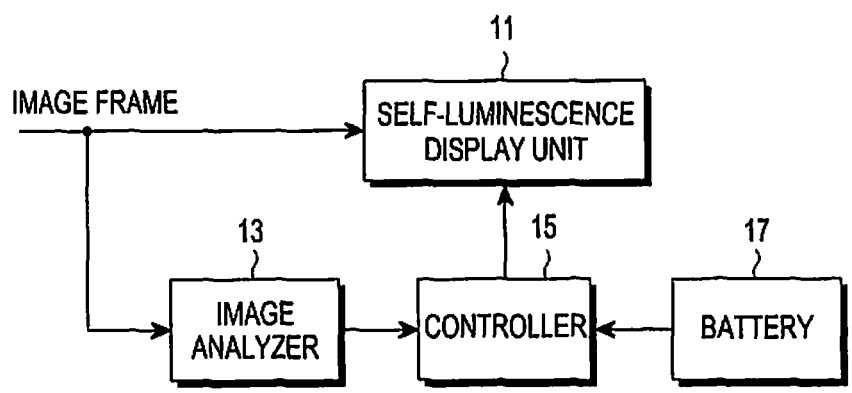
FIG. 1 is a block diagram illustrating a terminal apparatus, according to an embodiment of the present invention.

Embodiments of the present invention are described herein below with reference to the accompanying drawings. The same or similar components may be designated by the same or similar reference numerals although they are illustrated in different drawings. Detailed describes of constructions or processes known in the art may be omitted to avoid obscuring the subject matter of the present invention.

In the following description, although many specific items, such as components of a concrete circuit, are shown, they are only provided to assist in a general understanding of the present invention, and it will be understood by those of ordinary skill in the art that the present invention can be implemented without these specific items.

FIG. 1 is a block diagram illustrating a terminal apparatus, according to an embodiment of the present invention. Referring to FIG. 1, the terminal apparatus includes a self-luminescence display unit 11, an image analyzer 13, a controller 15, and a battery 17.

The self-luminescence display unit 11 receives an image frame and displays the received image frame.

The image analyzer 13 analyzes a histogram of the image frame displayed through the self-luminescence display unit 11 and determines a brightness value of the image frame.

The controller 15 receives the brightness value of the image frame from the image analyzer 13 and determines a power consumption of the self-luminescence display unit 11 corresponding to the brightness of the image frame. The controller 15 also determines and temporarily stores a current battery voltage value of the battery 17 every predetermined unit of time (e.g., 50 ms) and determines a battery voltage variance value obtained by subtracting the current battery voltage value of the battery 17 from a previously stored battery voltage value. The controller 15 also compensates for a voltage drop that instantaneously occurs in the self-luminescence display unit 11 based on a relationship between a voltage value dropped by the self-luminescence display unit 11 and the battery voltage variance value. A battery residual quantity is provided to the self-luminescence display unit 11.

Power consumed by a display may be variously changed according to a display manufacturing method, a display size, and a pixel structure of the display. Accordingly, the controller 15 may include a memory for storing a table for defining a relationship between the brightness of the image frame and the power consumption of the self-luminescence display unit 11 based on a display manufacturer, a display size, and other information in order to more accurately determine the power consumption. If the controller 15 receives the brightness of the image frame, the controller 15 determines the power consumption of the self-luminescence display unit 11 by applying the brightness of the image frame to the table.

In addition, when the controller 15 compensates for the voltage drop that instantaneously occurs in the self-luminescence display unit 11, the controller 15 compares the voltage value dropped by the self-luminescence display unit 11 with the battery voltage variance value first.

If the voltage value dropped by the self-luminescence display unit 11 is greater than the battery voltage variance value, the controller 15 estimates that a voltage value of the battery 17 has substantially decreased, determines the battery residual quantity to be displayed on the self-luminescence display unit 11 through a calculation of Equation (1) below, and provides a result of the calculation to the self-luminescence display unit 11.

$$V = V_{curBatt} - (V_{Lumin} - V_\delta) \quad (1)$$

V denotes the battery residual quantity to be displayed on the self-luminescence display unit 11, $V_{curBatt}$ denotes a current voltage value of the battery 17, $V_{Lumin}$ denotes a voltage value dropped by the self-luminescence display unit 11, and $V_\delta$ denotes a battery voltage variance value.

If the voltage value dropped by the self-luminescence display unit 11 is less than or equal to the battery voltage variance value, the controller 15 estimates that a voltage value of the battery 17 has not substantially decreased, determines the previously stored battery voltage value, and provides the previously stored battery voltage value to the self-luminescence display unit 11.

The image analyzer 13 can preferably determine the brightness value of the image frame by using histograms of Red (R), Green (G), and Blue (B) color components included in the image frame.

Figure 2:
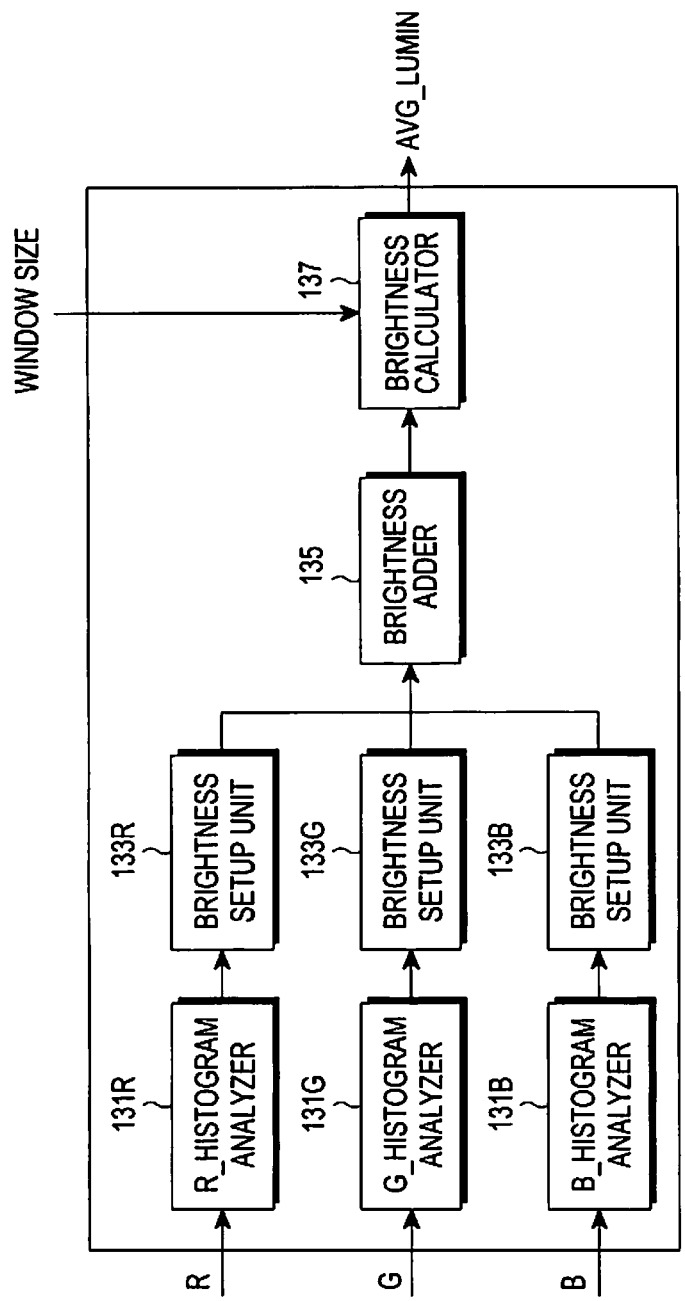
FIG. 2 is a block diagram illustrating an image analyzer of the terminal apparatus, according to an embodiment of the present invention.

FIG. 2 is a block diagram illustrating the image analyzer 13 of the terminal apparatus, according to an embodiment of the present invention. The image analyzer 13 determines the brightness value of the image frame by using histograms of R, G, and B color components. Referring to FIG. 2, the image analyzer 13 includes histogram analyzers 131R, 131G, and 131B for respectively analyzing histograms of R, G, and B color components. The image analyzer 13 also includes brightness level setup units 133R, 133G, and 133B for respectively setting brightness levels of the R, G, and B color components by determining the histograms of the R, G, and B color components. The image analyzer 13 further includes a brightness adder 135 for determining the brightness of an image frame by combining the brightness levels of the R, G, and B color components.

If a value output by the brightness adder 135 is provided to the controller 15 on an image frame basis, a brightness value due to an instantaneous change of an image frame can be directly reflected to determine the battery residual quantity. Accordingly, a brightness calculator 137 of the image analyzer 13 preferably calculates a mean value by adding the brightness of an image frame output from the brightness adder 135 on a predetermined frame unit (window size) basis and outputs the mean value. The predetermined frame unit (window size) may be set by a designer in a manufacturing process of the terminal apparatus or variously changed and applied according to a display speed of the image frame, a type of the image frame, etc.

Meanwhile, the self-luminescence display unit 11 consumes relatively more power when an image of a G color component is displayed rather than when an image of a B color component is displayed, and consumes relatively more power when an image of a B color component is displayed rather than when an image of a R color component is displayed. Accordingly, the brightness adder 135 preferably adds the brightness of an image frame by weighting each of the R, G, and B color components. For example, the brightness adder 135 can add the brightness of an image frame through a calculation of Equation (2) below.

$$\text{Lumin}_{weight} = HGM_G * \alpha + HGM_B * \beta + HGM_R * \gamma \quad (2)$$

$\text{Lumin}_{weight}$ denotes added brightness of an image frame, $HGM_G$, $HGM_B$, and $HGM_R$ denote brightness levels of R, G, and B color components, respectively, and $\alpha$, $\beta$, and $\gamma$ denote weights.

Figure 3:
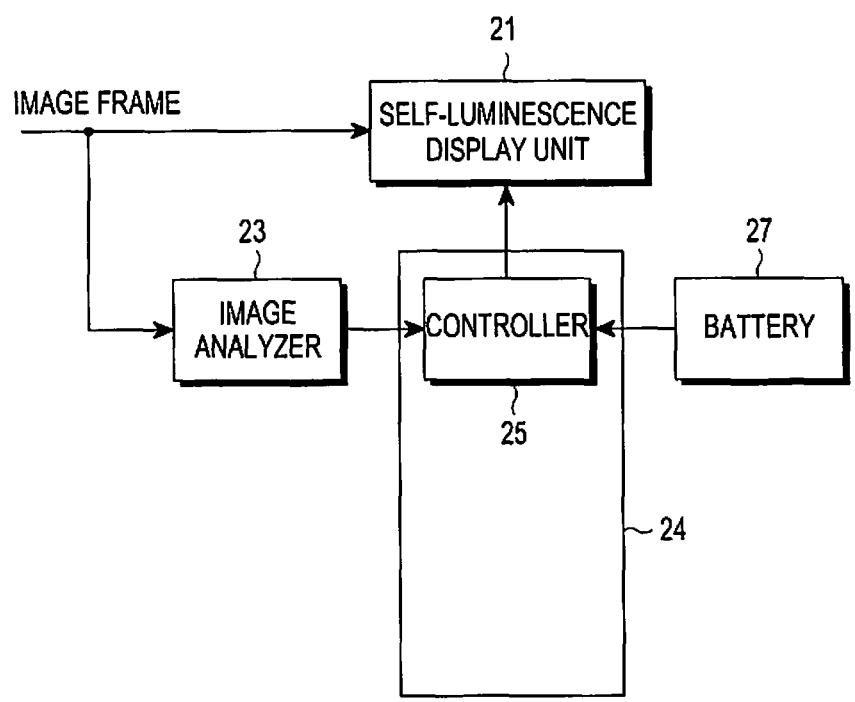
FIG. 3 is a block diagram illustrating a terminal apparatus, according to another embodiment of the present invention.

FIG. 3 is a block diagram illustrating a terminal apparatus, according to another embodiment of the present invention. Referring to FIG. 3, the terminal apparatus includes a self-luminescence display unit 21, an image analyzer 23, a controller 25, and a battery 27, which are respectively the same components as the self-luminescence display unit 11, the image analyzer 13, the controller 15, and the battery 17 included in the terminal apparatus shown in FIG. 1. However, the embodiments of FIG. 1 and FIG. 3 differ in that the controller 25 of the terminal apparatus of FIG. 3 is equipped in a modem 24.

Figure 4:
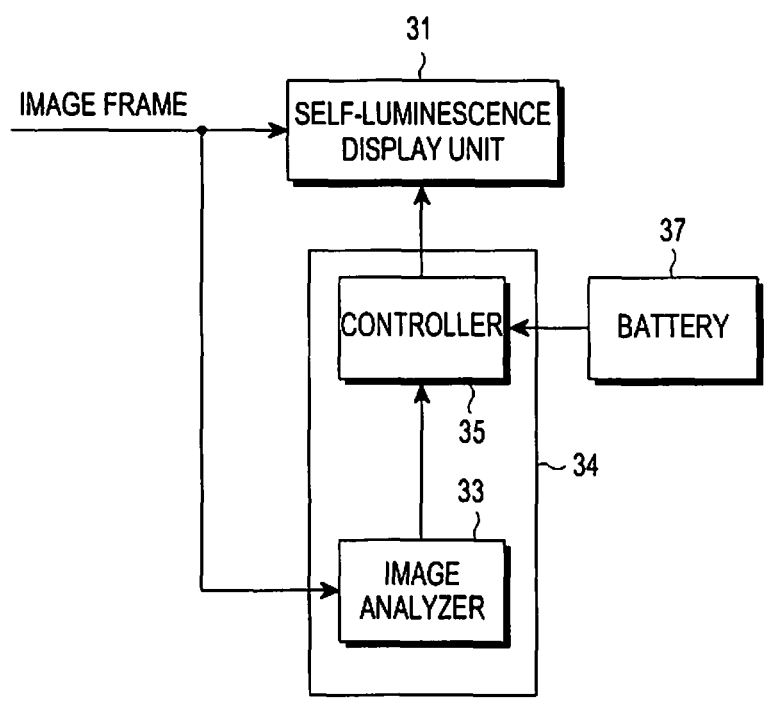
FIG. 4 is a block diagram illustrating a terminal apparatus, according to another embodiment of the present invention.

FIG. 4 is a block diagram illustrating a terminal apparatus, according to another embodiment of the present invention. Referring to FIG. 4, the terminal apparatus includes a self-luminescence display unit 31, an image analyzer 33, a controller 35, and a battery 37, which are respectively the same components as the self-luminescence display unit 11, the image analyzer 13, the controller 15, and the battery 17 included in the terminal apparatus shown in FIG. 1. However, the embodiments of FIG. 1 and FIG. 4 differ in that the image analyzer 33 and the controller 35 of the terminal apparatus of FIG. 4 are equipped in a modem 34.

Figure 5:
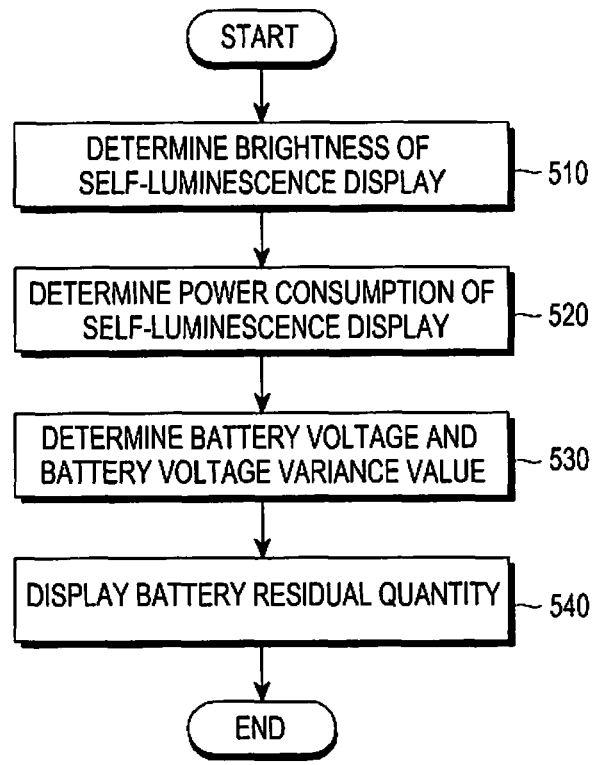
FIG. 5 is a flowchart illustrating a method for displaying battery residual quantity of a self-luminescence display, according to an embodiment of the present invention.

FIG. 5 is a flowchart illustrating a method for displaying battery residual quantity of a self-luminescence display, according to an embodiment of the present invention.

Referring to FIG. 5, in step 510, a histogram of an image frame output through the self-luminescence display is analyzed, and a brightness value of the image frame is determined.

In step 520, the brightness value of the image frame is received, and the power consumption of the self-luminescence display corresponding to the brightness of the image frame is determined. Specifically, since power that is consumed by a display may be variously changed according to a display manufacturing method, a display size, and a pixel structure of the display, a table for defining a relationship between the brightness of the image frame and the power consumption of the self-luminescence display based on a display manufacturer, a display size, and others, is stored in a memory in advance in order to more accurately determine the power consumption using characteristics of the display. Accordingly, in step 520, if the brightness of the image frame is received, the power consumption of the self-luminescence display is determined by applying the brightness of the image frame to the table.

In step 530, a current battery voltage value of battery is determined and temporarily stored, and a battery voltage variance value obtained by subtracting the current battery voltage value from a previously stored battery voltage value is determined.

In step 540, the battery residual quantity is provided to the self-luminescence display by compensating for a voltage drop that instantaneously occurs in the self-luminescence display based on a relationship between a voltage value dropped by the self-luminescence display and the battery voltage variance value. The self-luminescence display displays the battery residual quantity by compensating for an error value of battery residual quantity due to a driving voltage drop of the image frame.

Figure 6:
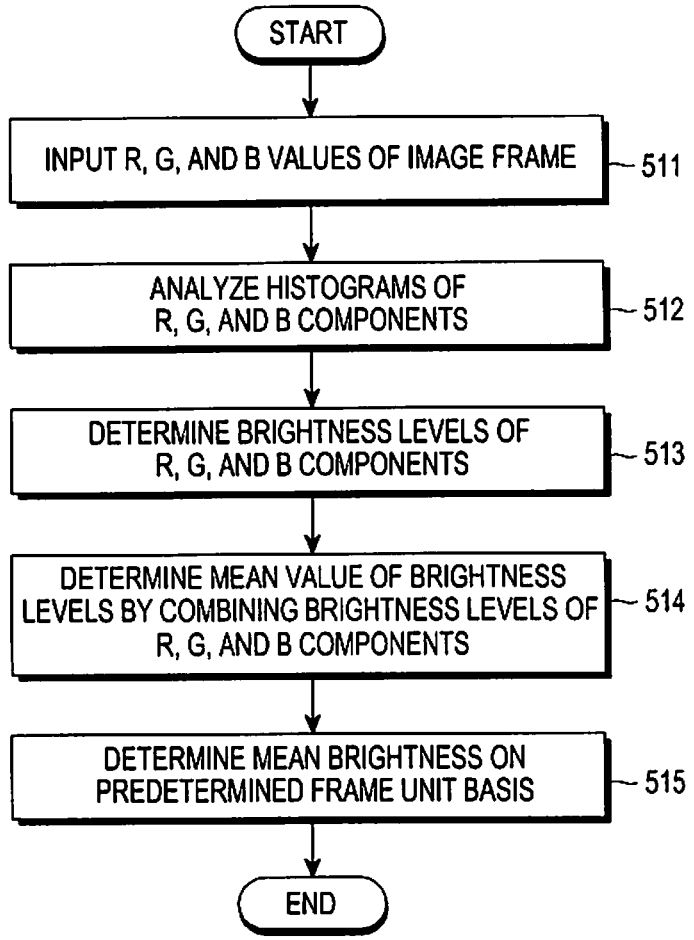
FIG. 6 is a flowchart illustrating a method for determining brightness of a self-luminescence display, according to an embodiment of the present invention.

FIG. 6 is a flowchart illustrating a method for determining the brightness of the self-luminescence display, according to an embodiment of the present invention. Specifically, FIG. 6 provides a more detailed description of step 510 of FIG. 5. Referring to FIG. 6, values of the R, G, and B color components are input from the image frame in step 511, and histograms of the R, G, and B color components are analyzed in step 512.

In step 513, brightness levels of the R, G, and B color components are set using brightness values obtained by analyzing the histograms of the R, G, and B color components. In step 514, the brightness levels of the R, G, and B color components in the image frame are added by combining the brightness levels of the R, G, and B color components.

Meanwhile, the self-luminescence display consumes relatively more power when an image of a G color component is displayed rather than when an image of a B color component is displayed, and consumes relatively more power when an image of a B color component is displayed rather than when an image of a R color component is displayed. Accordingly, in step 514, it is preferable that the brightness of an image frame is added by weighting each of the R, G, and B color components. For example, in step 514, it is preferable that the brightness of an image frame is added through a calculation of Equation (3) below.

$$Lumin_{weight} = HGM_G * \alpha + HGM_B * \beta HGM_R * \gamma \quad (3)$$

$Lumin_{weight}$ denotes added brightness of an image frame, $HGM_G$, $HGM_B$, and $HGM_R$ denote brightness levels of R, G, and B color components, respectively, and $\alpha$, $\beta$, and $\gamma$ denote weights.

If the brightness level added in step 514 is output on an image frame basis, a brightness value due to an instantaneous change of an image frame can be directly reflected to determine the battery residual quantity. Accordingly, in step 515, it is preferable that a mean value is calculated and output on a predetermined frame unit (window size). Furthermore, the predetermined frame unit (window size) may be set by a designer in a manufacturing process of the terminal apparatus or variously changed and applied according to a display speed of the image frame, a type of the image frame, etc.

Figure 7:
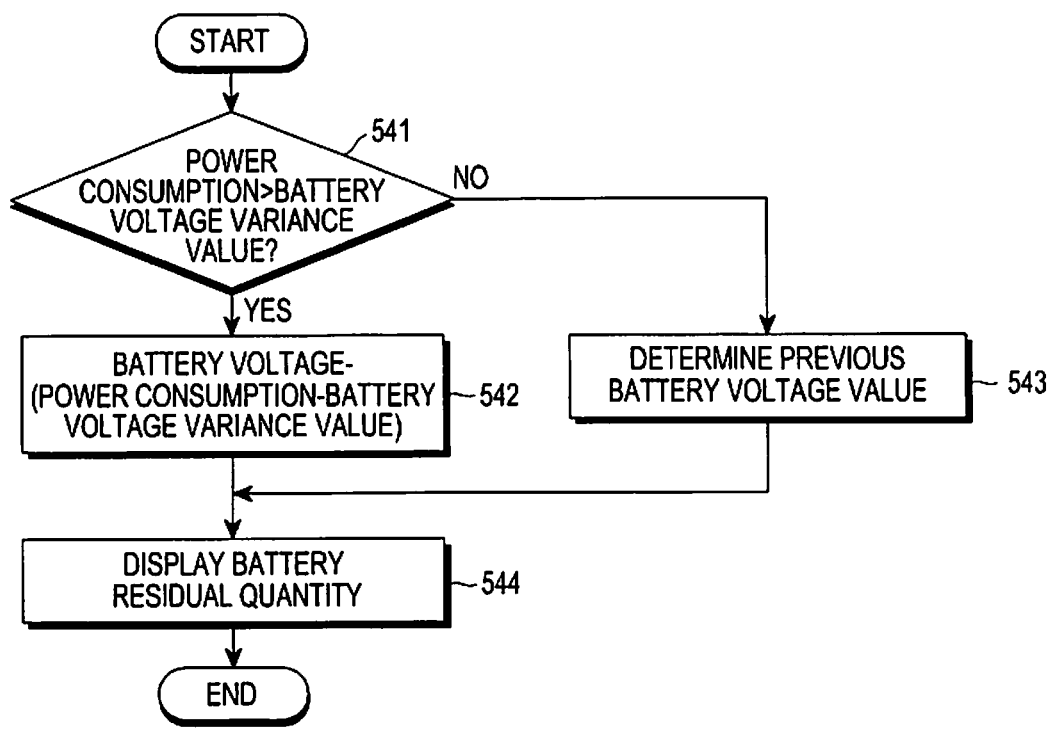
FIG. 7 is a flowchart illustrating a method for displaying battery residual quantity, according to an embodiment of the present invention.

FIG. 7 is a flowchart illustrating a method for displaying the battery residual quantity, according to an embodiment of the present invention. More specifically, FIG. 7 provides a detailed description of step 540 of FIG. 5. Referring to FIG. 7, in order to compensate for the voltage drop that instantaneously occurs in the self-luminescence display, the voltage value (consumed voltage value) dropped by the self-luminescence display is compared with the battery voltage variance value in step 541. If the voltage value dropped by the self-luminescence display is greater than the battery voltage variance value, the process proceeds to step 542, and if the voltage value dropped by the self-luminescence display is less than or equal to the battery voltage variance value, the process proceeds to step 543.

In step 542, it is estimated that a battery voltage value has substantially decreased, and the battery residual quantity to be displayed on the self-luminescence display is determined through a calculation of Equation (4) below.

$$V = V_{curBatt} - (V_{Lumin} - V_\delta) \quad (4)$$

V denotes the battery residual quantity to be displayed on the self-luminescence display, $V_{curBatt}$ denotes a current battery voltage value, $V_{Lumin}$ denotes a voltage value dropped by the self-luminescence display, and $V_\delta$ denotes a battery voltage variance value.

In step 543, it is estimated that a battery voltage value has not substantially decreased, and the previously stored battery voltage value is determined.

In step 544, the battery residual quantity determined in step 542 or 543 is displayed through the self-luminescence display.

According to embodiments of the present invention, an error of the battery residual quantity due to a voltage that is instantaneously dropped by a self-luminescence display can be corrected and displayed.

In addition, the battery residual quantity can be displayed by accurately reflecting power that is actually consumed from battery.

While the invention has been shown and described with reference to certain embodiments thereof, it will be understood by those skilled in the art that various changes in form and detail may be made therein without departing from the spirit and scope of the invention as defined by the appended claims.

What is claimed is:

1. A method for displaying a battery residual quantity of a portable terminal having a self-luminescence display, the method comprising the steps of: determining a brightness value of an image frame by analyzing a histogram of the image frame output through the self- luminescence display; determining a power consumption of the self-luminescence display based on the brightness value of the image frame output through the self-luminescence display; determining a battery voltage and a battery voltage variance value, wherein the battery voltage variance value is obtained by subtracting the current battery voltage value from a previously stored voltage value; displaying the battery residual quantity in accordance with the power consumption of the self-luminescence display and the battery voltage variance value, wherein the power consumption of the self-luminescence display is a predetermined power value spent on outputting the brightness value of the image frame.

2. The method of claim 1, wherein the histogram of the image frame comprises histograms of Red (R), Green (G), and Blue (B) color components included in the image frame.

3. The method of claim 2, wherein determining the brightness value of the image frame comprises:
determining brightness values of the R, G, and B color components; and
determining a mean brightness value of a predetermined number of image frames.

4. The method of claim 3, wherein determining the power consumption of the self-luminescence display comprises determining the power consumption of the self-luminescence display based on a relationship between the mean brightness value and the power consumption of the self-luminescence display.

5. The method of claim 3, wherein determining the brightness values of the R, G, and B color components comprises:
determining predetermined levels of histogram brightness of the R, G, and B color components; and
weighting the brightness values of the R, G, and B color components and determining a mean value of the weighted brightness values of the R, G, and B color components.

6. The method of claim 1, further comprising:
comparing the power consumption of the self-luminescence display with the battery voltage variance value;
when the power consumption of the self-luminescence display is greater than the battery voltage variance value, determining the battery residual quantity by subtracting a difference between the power consumption of the self-luminescence display and the battery voltage variance value from the battery voltage;
when the power consumption of the self-luminescence display is less than or equal to the battery voltage variance value, determining a previously measured battery voltage value as the battery residual quantity; and
displaying the battery residual quantity.

7. A terminal having a self-luminescence display, the terminal comprising: an image analyzer for determining a brightness value of an image frame by analyzing a histogram of the image frame displayed through the self-luminescence display; a battery for supplying power required to drive the self-luminescence display; and a controller for receiving the brightness value of the image frame displayed through the self-luminescence display, determining a power consumption of the self-luminescence display corresponding to the brightness value of the image frame displayed through the self-luminescence display, determining a battery voltage and a battery voltage variance value, wherein the battery voltage variance value is obtained by subtracting the current battery voltage value from a previously stored voltage value; displaying a battery residual quantity through the self-luminescence display in accordance with the power consumption of the self-luminescence display and the battery voltage variance value, wherein the power consumption of the self-luminescence display is a predetermined power value spent on outputting the brightness value of the image frame.

8. The terminal of claim 7, wherein the image analyzer analyzes histograms of Red (R), Green (G), and Blue (B) color components included in the image frame.

9. The terminal of claim 8, wherein the image analyzer determines brightness values of the R, G, and B color components and determines a mean brightness value of a predetermined number of image frames.

10. The terminal of claim 9, wherein the controller determines a power consumption of the self-luminescence display by applying the brightness value of the image frame to a relationship between the mean brightness value and the power consumption of the self-luminescence display.

11. The terminal of claim 9, wherein the image analyzer calculates the brightness value of the image frame by determining predetermined levels of histogram brightness of the R, G, and B color components, weighting the brightness values of the R, G, and B color components, and determining a mean value of the weighted brightness values of the R, G, and B color components.

12. The terminal of claim 7, wherein the controller compares the power consumption of the self-luminescence display with the battery voltage variance value, displays the battery residual quantity by determining the brightness value by subtracting a difference between the power consumption of the self-luminescence display and the battery voltage variance value from the battery voltage when the power consumption of the self-luminescence display is greater than the battery voltage variance value, and displays the battery residual quantity by determining a previously measured battery voltage value as the battery residual quantity when the power consumption of the self-luminescence display is less than or equal to the battery voltage variance value.

13. A method for displaying a battery residual quantity of a portable terminal having a self-luminescence display, the method comprising the steps of : determining a brightness value of an image frame by analyzing a histogram of the image frame output through the self- luminescence display; determining a power consumption of the self-luminescence display based on the brightness value of the image frame output through the self-luminescence display; determining a battery voltage and a battery voltage variance value, wherein the battery voltage variance value is obtained by subtracting the current battery voltage value from a previously stored voltage value; displaying the battery residual quantity in accordance with the power consumption of the self-luminescence display and the battery voltage variance value, wherein determining the power consumption of the self-luminescence display is determined based on a relationship between a mean brightness value of a predetermined number of image frames and the power consumption of the self-luminescence display.

14. The method of claim 13, wherein the histogram of the image frame comprises histograms of Red (R), Green (G), and Blue (B) color components included in the image frame.

15. The method of claim 14, wherein determining the brightness value of the image frame comprises determining brightness values of the R, G, and B color components.

16. The method of claim 15, wherein determining the brightness values of the R, G, and B color components comprises:
determining predetermined levels of histogram brightness of the R, G, and B color components; and
weighting the brightness values of the R, G, and B color components and determining a mean value of the weighted brightness values of the R, G, and B color components.

17. A terminal having a self-luminescence display, the terminal comprising: an image analyzer for determining a brightness value of an image frame by analyzing a histogram of the image frame displayed through the self-luminescence display; a battery for supplying power required to drive the self-luminescence display; and a controller for receiving the brightness value of the image frame displayed through the self-luminescence display, determining a power consumption of the self-luminescence display corresponding to the brightness value of the image frame displayed through the self-luminescence display, determining a battery voltage and a battery voltage variance value, wherein the battery voltage variance value is obtained by subtracting the current battery voltage value from a previously stored voltage value; displaying a battery residual quantity through the self-luminescence display in accordance with the power consumption of the self-luminescence display and the battery voltage variance value, wherein determining the power consumption of the self-luminescence display is determined based on a relationship between a mean brightness value of a predetermined number of image frames and the power consumption of the self-luminescence display.

18. The terminal of claim 17, wherein the image analyzer analyzes histograms of Red (R), Green (G), and Blue (B) color components included in the image frame.

19. The terminal of claim 18, wherein the image analyzer determines brightness values of the R, G, and B color components and determines a mean brightness value of a predetermined number of image frames.

20. The terminal of claim 19, wherein the image analyzer calculates the brightness value of the image frame by determining predetermined levels of histogram brightness of the R, G, and B color components, weighting the brightness values of the R, G, and B color components, and determining a mean value of the weighted brightness values of the R, G, and B color components.

* * * * *